(12) United States Patent
Dominguez et al.

(10) Patent No.: US 8,344,352 B2
(45) Date of Patent: *Jan. 1, 2013

(54) USING UNSTABLE NITRIDES TO FORM SEMICONDUCTOR STRUCTURES

(75) Inventors: Juan E. Dominguez, Hillsboro, OR (US); Adrien R. Lavoie, Beaverton, OR (US); John J. Plombon, Portland, OR (US); Joseph H. Han, San Jose, CA (US); Harsono S. Simka, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/185,094

(22) Filed: Jul. 18, 2011

(65) Prior Publication Data

US 2011/0272811 A1 Nov. 10, 2011

Related U.S. Application Data

(60) Continuation of application No. 12/788,603, filed on May 27, 2010, now Pat. No. 7,982,204, which is a division of application No. 11/359,060, filed on Feb. 22, 2006, now Pat. No. 7,749,906.

(51) Int. Cl.
  *H01L 29/06* (2006.01)

(52) U.S. Cl. ........ . 257/9; 257/43; 257/E29.245; 257/E23.161; 977/762

(58) Field of Classification Search ................ 257/9, 43, 257/E29.245, E23.161; 977/762
See application file for complete search history.

(56) References Cited

U.S. PATENT DOCUMENTS

| | | | |
|---|---|---|---|
| 4,897,287 A | | 1/1990 | Berger et al. |
| 6,165,894 A | * | 12/2000 | Pramanick et al. ........... 438/627 |
| 6,911,405 B2 | * | 6/2005 | Shioya et al. ................. 438/798 |
| 2006/0099758 A1 | * | 5/2006 | Zhang et al. .................. 438/222 |
| 2006/0228901 A1 | | 10/2006 | Yoon et al. |
| 2006/0269729 A1 | * | 11/2006 | Gan et al. ...................... 428/209 |

FOREIGN PATENT DOCUMENTS

KR  10-2005-0006409 A   1/2005

* cited by examiner

*Primary Examiner* — Brook Kebede
(74) *Attorney, Agent, or Firm* — David L. Guglielmi

(57) ABSTRACT

Incompatible materials, such as copper and nitrided barrier layers, may be adhered more effectively to one another. In one embodiment, a precursor of copper is deposited on the nitrided barrier. The precursor is then converted, through the application of energy, to copper which could not have been as effectively adhered to the barrier in the first place.

20 Claims, 2 Drawing Sheets

USING UNSTABLE NITRIDES TO FORM SEMICONDUCTOR STRUCTURES

CROSS-REFERENCE TO RELATED APPLICATIONS

This application a continuation of U.S. patent application Ser. No. 12/788,603, filed on May 27, 2010, which is a divisional of U.S. patent application Ser. No. 11/359,060, filed on Feb. 22, 2006, now patented as U.S. Pat. No. 7,749,906.

BACKGROUND

This invention relates generally to the fabrication of integrated circuits.

In the fabrication of integrated circuits, it is desirable to use a variety of different materials over a variety of different substrates. Sometimes materials that an engineer would like to use over a given substrate are incompatible with that substrate. By "incompatible" it is intended to mean that the upper material cannot be deposited onto the lower layer with sufficient adherence to the lower layer to avoid delamination.

Thus, commonly, in order to adhere these incompatible layers to one another, special deposition techniques are required or adhesion layers must be provided between the incompatible layers.

It is also desirable in a variety of applications to form nanowires or very small electrical conductors in semiconductor integrated circuits. Commonly, the deposition of such small conductors is extremely difficult. Moreover, to form a conductor, such as a copper conductor buried in other material, involves a large and cost ineffective number of process steps.

DETAILED DESCRIPTION

Figure 1:
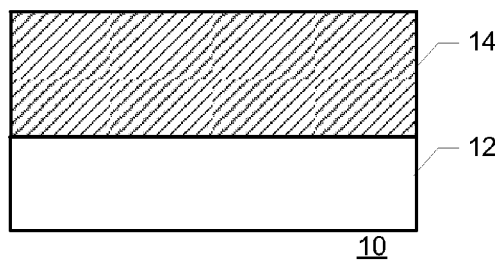
FIG. 1 is an enlarged, cross-sectional view at an early stage of manufacture according to one embodiment.

Referring to FIG. 1, a layer of a first material 12, over a substrate or wafer 10, may receive on its upper surface a deposit of a second material 14. The material 14 and the material 12 may be sufficiently compatible that adequate adherence can be obtained between the materials 12 and 14 in some embodiments. However, the material 14, now adhered to the material 12, may then be converted to another material incompatible with the material 12 if directly deposited on the material 12. By depositing the material 14 in a first form and then converting it into a second form, the incompatible material may be successfully adhered to the first material 12.

As an example, the material 12 may be a nitrided barrier layer such as titanium nitride or tungsten nitride. The material 14, in one embodiment, may be an unstable metal nitride, such as $Cu_3N$ or $Cu_4N$, as two examples. As another example, the material 14 may be $Ni_3N$.

In one embodiment, the material 14 is deposited by a atomic layer deposition (ALD) and/or chemical vapor deposition (CVD). Precursors may be used to deposit the unstable metal nitrides by ALD or CVD, including, but not limited to, copper amidinate variants, betadiketiminates, azaallyls, betadiketonates, pyridines, cyclic arenes, and alkenes. Deposition of the material 14 may take place at a substrate temperature between 80° C. and 150° C., under chamber pressures between 100 mTorr to 10 Torr, in some embodiments. Co-reactants may be pulsed or flown to form unstable metal nitrides such as $Cu_3N$ or $Cu/Cu_3N$ mixtures. The co-reactants may include, but are not limited to, $NH_3$, primary amines, secondary amines, tertiary amines, hydrazine, BR3-amine adducts (where R is alkyl, proton or both and the amine is primary, secondary, tertiary), azides, as well as pure nitrogen, nitrogen plasma, or $N_2/H_2$ plasma, as well as any plasma and combinations from aforementioned chemicals.

Figure 2:
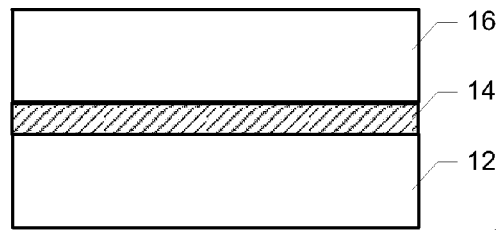
FIG. 2 is an enlarged, cross-sectional view at a subsequent stage of manufacture according to one embodiment.

Then, referring to FIG. 2, the material 14 may be decomposed to form a pure or substantially nitride free metal layer 16. After deposition of on patterned wafers, the layer 16 is decomposed to pure copper, in one embodiment, or pure nickel, in another embodiment, where $Ni_3N$ is used. Methods for decomposing the material 14 include thermal annealing in pure hydrogen gas, diluted hydrogen gas in an inert gas, annealing in $NH_3$ or nitrogen gas, at temperatures ranging from 200° C. to 500° C., for times ranging between five minutes to 120 minutes. The $Cu_3N$ material 14 may transform into near bulk copper conductivity within about one hour.

In another embodiment, an electron beam, with appropriate diameter and energy, may be used to decompose the $Cu_3N$ into copper. Other thermal decomposition techniques may be used, including rapid thermal annealing in vacuum and joule heating using a resistive underlayer. Non-thermal decomposition may also be used, including ion implantation, ion bombardment, light, and plasma (remote and near) annealing.

Figure 3:
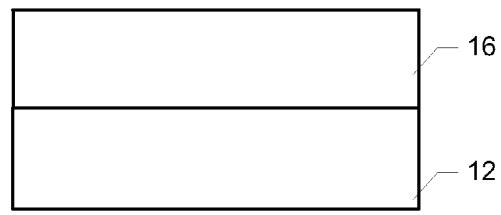
FIG. 3 is an enlarged, cross-sectional view at a stage subsequent to the stage shown in FIG. 1 according to one embodiment.

In some embodiments, as shown in FIG. 3, the material 14 may be converted entirely into a pure metal layer 16. In other embodiments, as shown in FIG. 2, the conversion may be incomplete, leaving a thin layer of material 14 between the pure metal layer 16 and the material 12. Thus, the material 14 remains in contact with the first material 12 over a substrate 10, such as a silicon substrate.

The material 14 may serve as an adhesion layer to the nitrided barrier material 12. The conversion of the material 14 allows the deposition of two consecutive ALD or CVD layers for barrier and seed, all in one deposition step in some embodiments.

The presence of a nitrided barrier material 12 may also act as a getterer of nitrogen and may not allow the formation of CuN layers in the pure copper film. A preferred embodiment uses ALD TaN as the nitrided barrier with Cu-nitride deposition. In addition, the $Cu_3N$ material may be deposited directly on silicon or carbon doped silicon to form SiCN, which may act as a barrier to copper diffusion. In still another embodiment, the $Cu_3N$ layer is deposited on porous low dielectric constant material and can serve as a dual sacrificial pore sealing/adhesion layer.

Figure 4:
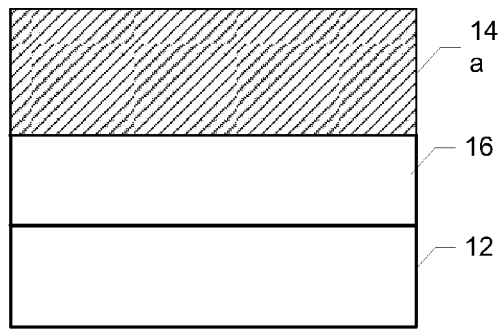
FIG. 4 is an enlarged, cross-sectional view at a subsequent stage to FIG. 3 in accordance with one embodiment of the present invention.

Referring to FIG. 4, in some embodiments, a $Cu_3N$ layer 14a may be used as a sacrificial/morphing non-reflective coating on a copper metal layer 16 to permit further patterning using optical techniques. In such case, a $Cu_3N$ layer 14a may first be deposited and post-treated to pure copper metal layer 16, as indicated in FIG. 3. Then a second $Cu_3N$ layer 14a may be deposited over the reflective metal layer 16. The $Cu_3N$ layer 14a acts as a non-reflective layer for patterning an overlying resist and etching. After the patterning is complete, the Cu₃N layer 14a can act as an adhesion layer or be reverted back to a conductive or pure metal layer.

In a further embodiment, copper and Cu₃N may be used as selective etching layers, or Cu₃N can be selectively etched over copper to produce conductive copper lines.

Figure 5:
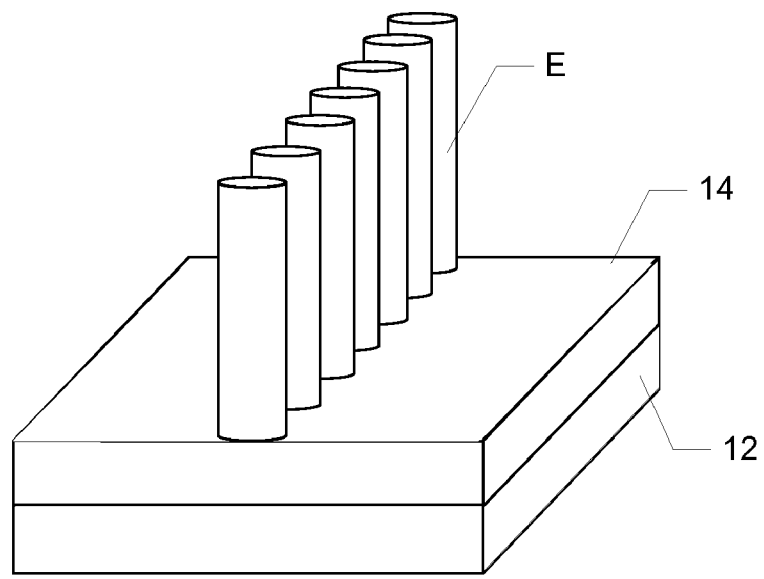
FIG. 5 is an enlarged, cross-sectional view of another embodiment of the present invention.
Figure 6:
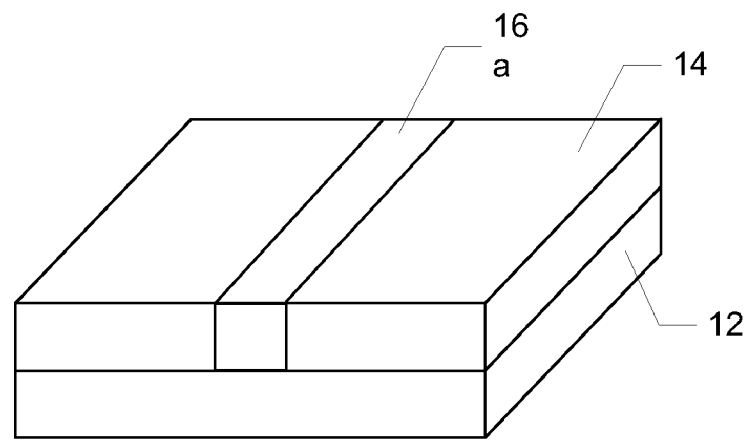
FIG. 6 is an enlarged, cross-sectional view of still another embodiment of the present invention.

Moving to FIG. 5, in accordance with one embodiment of the present invention, an atomic layer deposition metal nitride material 14 may be formed over a nitrided barrier material 12 on top of a substrate 10, such as a silicon substrate. The material 14 may be selectively converted into pure or substantially nitride free copper metal strip 16a by the use of an electron beam E or other methods already mentioned. A nano-patterned metal strip 16a, shown in FIG. 6, may be obtained by placing the nanometer sized (i.e., of a width on the order of a billionth of a meter) electron beam E at exact locations using a reticle or precise beam location. For example, a nanowire may be formed by moving the electron beam over the material 14. The surrounding unconverted dielectric material 14 can be used as an encapsulating material to avoid line shorting.

In some embodiments of the present invention, it is possible to deposit films with precise thickness and composition control. The deposition of conformal, uniform, and nanometer-sized films may be achieved in some embodiments with a nitrided cap and sidewalls to prevent full line oxidation. Conductive lines or layers may be precisely located in some cases and improved adhesion to silicon or nitrided substrates may be achieved. Also, low reflectivity enabling patterning may be accomplished in some cases. In some embodiments, deposition and patterning of ultra-thin lines may be achieved with width and height less than ten nanometers or to a size enabled by electron beams or scanning tunneling microscopy (STM) resolution.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
   a semiconductor substrate;
   a layer of metal nitride including at least three metal atoms per nitrogen atom;
   a layer of copper nitride over the layer of metal nitride; and
   a layer of the pure metal over the layer of copper nitride.

2. The structure of claim 1 wherein said substrate includes a nitride material.

3. The structure of claim 2 wherein said substrate includes a titanium or tungsten nitride.

4. The structure of claim 1 wherein said metal is copper.

5. The structure of claim 1 wherein the layer of pure metal is formed by annealing the copper nitride layer.

6. The structure of claim 1 wherein the layer of pure metal is formed by annealing the copper nitride layer at an elevated temperature from about 200° C. to about 500° C.

7. The structure of claim 1 wherein the layer of metal nitride comprises TaN or TiN.

8. The structure of claim 1 wherein the copper nitride layer is formed by chemical vapor deposition (CVD) or atomic layer deposition (ALD).

9. A semiconductor structure comprising:
   a substrate;
   a substantially nitride free metal layer over said substrate;
   a metal nitride over said metal, said metal nitride including at least three metal atoms per nitrogen atom; and
   a copper nitride layer over the metal nitride.

10. The structure of claim 9 wherein said metal is copper.

11. The structure of claim 9 wherein said substrate is a nitride.

12. The structure of claim 11 wherein said substrate includes tungsten or titanium nitride.

13. A semiconductor structure comprising:
    a substrate;
    a metal nitride layer over said substrate;
    a copper nitride layer over the metal nitride layer; and
    a region of substantially nitride free metal formed in the copper nitride layer.

14. The structure of claim 13 wherein said metal nitride does not include the same metal as said substantially nitride free metal.

15. The structure of claim 13 wherein said metal is elongated.

16. The structure of claim 15 wherein said metal is a nanowire.

17. The structure of claim 13 wherein the substantially nitride free metal is formed by annealing the copper nitride layer.

18. The structure of claim 13 wherein the substantially nitride free metal is formed by annealing the copper nitride layer at an elevated temperature from about 200° C. to about 500° C.

19. The structure of claim 13 wherein the metal nitride layer comprises TaN or TiN.

20. The structure of claim 13 wherein the copper nitride layer is formed by chemical vapor deposition (CVD) or atomic layer deposition (ALD).

* * * * *